(12) United States Patent
Wen et al.

(10) Patent No.: US 9,564,436 B2
(45) Date of Patent: Feb. 7, 2017

(54) SEMICONDUCTOR DEVICE

(71) Applicant: United Microelectronics Corp., Hsinchu (TW)

(72) Inventors: Yung-Ju Wen, Taoyuan County (TW); Chang-Tzu Wang, Taoyuan County (TW); Tien-Hao Tang, Hsinchu (TW); Kuan-Cheng Su, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 85 days.

(21) Appl. No.: 14/082,529

(22) Filed: Nov. 18, 2013

(65) Prior Publication Data
US 2015/0137255 A1   May 21, 2015

(51) Int. Cl.
| H02H 9/04 | (2006.01) |
| H01L 27/092 | (2006.01) |
| H01L 27/02 | (2006.01) |
| H01L 27/088 | (2006.01) |

(52) U.S. Cl.
CPC ......... *H01L 27/092* (2013.01); *H01L 27/0277* (2013.01); *H01L 27/088* (2013.01)

(58) Field of Classification Search
None
See application file for complete search history.

(56) References Cited

U.S. PATENT DOCUMENTS

| 6,365,932 | B1* | 4/2002 | Kouno et al. ................. 257/341 |
| 6,399,990 | B1* | 6/2002 | Brennan et al. .............. 257/355 |
| 6,664,599 | B1 | 12/2003 | Chen et al. |
| 6,774,017 | B2* | 8/2004 | Brown .............. H01L 21/76232 257/E21.339 |
| 2006/0065931 | A1* | 3/2006 | Lee ..................... H01L 27/0277 257/355 |
| 2009/0034136 | A1* | 2/2009 | Disney ................ H01L 27/0251 361/56 |
| 2010/0295094 | A1* | 11/2010 | Albers ................ H01L 29/7436 257/173 |
| 2011/0221002 | A1* | 9/2011 | Chen ................... H01L 27/0266 257/349 |
| 2011/0260254 | A1* | 10/2011 | Kim ..................... H01L 27/0277 257/355 |
| 2013/0020645 | A1* | 1/2013 | Campi, Jr. .......... H01L 27/0266 257/355 |

(Continued)

OTHER PUBLICATIONS

Polgreen et al., "Improving the ESD Failure Threshold of Silicided n-MOS Output Transistors by Ensuring Uniform Current Flow," IEEE Transactions on Electron Devices, Feb. 1992, pp. 379-388.

(Continued)

*Primary Examiner* — Ali Naraghi
(74) *Attorney, Agent, or Firm* — J.C. Patents

(57) ABSTRACT

A semiconductor device is described, including a substrate including a first area and a second area, a first MOS element of a first conductivity type in the first area, and a second MOS element of the first conductivity type in the second area. The first area is closer to a pick-up region of the substrate than the second area. The substrate has a second conductivity type. The bottom depth of a first electrical conduction path in the substrate in the first area is smaller than that of a second electrical conduction path in the substrate in the second area.

21 Claims, 1 Drawing Sheet

(56) References Cited

U.S. PATENT DOCUMENTS

2013/0168772 A1   7/2013 Wen

OTHER PUBLICATIONS

Amerasekera et al., "The Impact of Technology Scaling on ESD Robustness and Protection Circuit Design," IEEE Transactions on Components, Packaging, and Manufacturing Technology, Part A, Jun. 1995, pp. 314-320.
Lee et al., "An Analytical Model of Positive H.B.M ESD Current Distribution and the Modified Multi-Finger Protection Structure," Proceedings of the 1999 7th International Symposium on the Physical and Failure Analysis of Integrated Circuits, Jul. 1999, pp. 162-167.
Chen et al., "Experimental investigation on the HBM ESD characteristics of CMOS devices in a 0.35-μm silicided process," International Symposium on VLSI Technology, Systems, and Applications, Jun. 1999, pp. 35-38.
Amerasekera et al., "Correlating Drain Junction Scaling, Salicide Thickness, and Lateral NPN Behavior, with the ESD/EOS Performance of a 0.25 μm CILIOS Process," International Electron Devices Meeting, Dec. 8-11, 1996, pp. 893-896.
Bock et al., "Influence of gate length on ESD-performance for deep sub micron CMOS technology," Electrical Overstress/Electrostatic Discharge Symposium Proceedings, Sep. 28-30, 1999, pp. 95-104.
Ker et al., "Layout design on multi-finger MOSFET for on-chip ESD protection circuits in a 0.18-μm salicided CMOS process," The 8th IEEE International Conference on Electronics, Circuits and Systems, Sep. 2001, pp. 361-364.
Ker et al., "The Impact of Inner Pickup on ESD Robustness of Multi-Finger NMOS in Nanoscale CMOS Technology," 44th Annual., IEEE International Reliability Physics Symposium Proceedings, Mar. 26-30, 2006, pp. 631-632.

\* cited by examiner

SEMICONDUCTOR DEVICE

BACKGROUND OF THE INVENTION

Field of Invention

This invention relates to a structure of a semiconductor device, particularly a structure of an electrostatic discharge (ESD) device.

Description of Related Art

With continuous reduction in dimensions, the integrated circuits are more easily damaged by ESD, so ESD protection devices are usually designed in integrated circuits. One type of ESD protection device is the multi-finger transistor, which usually includes multiple NMOS elements arranged in parallel. The electrostatic discharge of such a device is based on the switching of the parasitic bipolar junction transistors (BJT) each formed by the source and drain regions of a NMOS element and the substrate.

However, since the central NMOS elements are more distant from the pick-up regions of the substrate, the base resistance of the corresponding parasitic BJT is higher. Meanwhile, since the breakdown voltages of the drain regions of all NMOS elements are the same, the magnitude of the breakdown current from each drain to the substrate is uniform. Hence, in an ESD event, the junction voltage (V=I×R) between the collector (drain) and the base (substrate) of the central BJTs is higher, so the central BJTs are switched on first. The details can be found in "*An analytical model of positive H.B.M ESD current distribution and the modified multi-finger protection structure,*" Proc. Int. Symp. on Physical and Failure Analysis of Integrated Circuits, 1999, pp. 162-167.

As a result, most ESD current will flow through the central NMOS, and contact spiking or junction punch easily occurs to the drain region thereof to significantly deteriorate the ESD protection function of the multi-finger transistor.

SUMMARY OF THE INVENTION

In view of the foregoing, this invention provides a semiconductor device, which is capable of decreasing the base resistance difference between central MOS element(s) and edge MOS element(s) as being applied as a multi-finger transistor.

The semiconductor device of this invention includes a substrate including a first area and a second area, a first MOS element of a first conductivity type in the first area, and a second MOS element of the first conductivity type in the second area. The first area is closer to a pick-up region of the substrate than the second area. The substrate has a second conductivity type. The bottom depth of the electrical conduction path in the substrate in the first area is smaller than that of the electrical conduction path in the substrate in the second area.

In another aspect of this invention, the semiconductor device includes a substrate including a first area and a second area, a first MOS element of a first conductivity type above a first level in the substrate in the first area, a second MOS element of the first conductivity type above the first level in the substrate in the second area, and an isolation layer buried in the substrate in the first area but not extending to the second area. The first area is closer to a pick-up region of the substrate than the second area. A first distance between the first level and the top of the isolation layer is smaller than a second distance between the first level and the bottom level of the substrate in the second area.

In some embodiments of the semiconductor device, the isolation layer includes an insulating layer. In other embodiments, the isolation layer includes a deep well of the first conductivity type.

In an embodiment, the semiconductor device include an electrostatic discharge (ESD) device, which may include a multi-finger MOS device that includes the first MOS element and the second MOS element are parts thereof.

In a case where the above semiconductor device serves as a multi-finger device for ESD, because the bottom depth of the electrical conduction path in the substrate in the first area closer to the pick-up region is smaller than that of the electrical conduction path in the substrate in the second area, a slight current bottleneck is present in the first area. As a result, the base resistance difference between the central MOS elements and the edge MOS elements of the multi-finger device is decreased, so the ESD current is not so concentrated in the central MOS elements as in the prior art, and the central MOS elements are prevented from damage.

In order to make the aforementioned and other objects, features and advantages of the present invention comprehensible, a preferred embodiment accompanied with figures is described in detail below.

DESCRIPTION OF EMBODIMENTS

The following embodiments are intended to further explain this invention but not to limit the scope thereof. For example, though the semiconductor device described in the embodiments is a multi-finger MOS device for ESD, the semiconductor device of this invention may alternatively be a FinFET device. Moreover, although the first and second MOS elements are NMOS elements in the embodiments, they may alternatively be BJT elements, LDMOS (Laterally Diffused MOS) elements, or DDMOS (Double Diffused MOS) elements.

Further, though the first conductivity type is N-type and the second conductivity type is P-type in the embodiments, it is also possible that the first conductivity type is P-type and the second conductivity type is N-type.

Figure 1A:
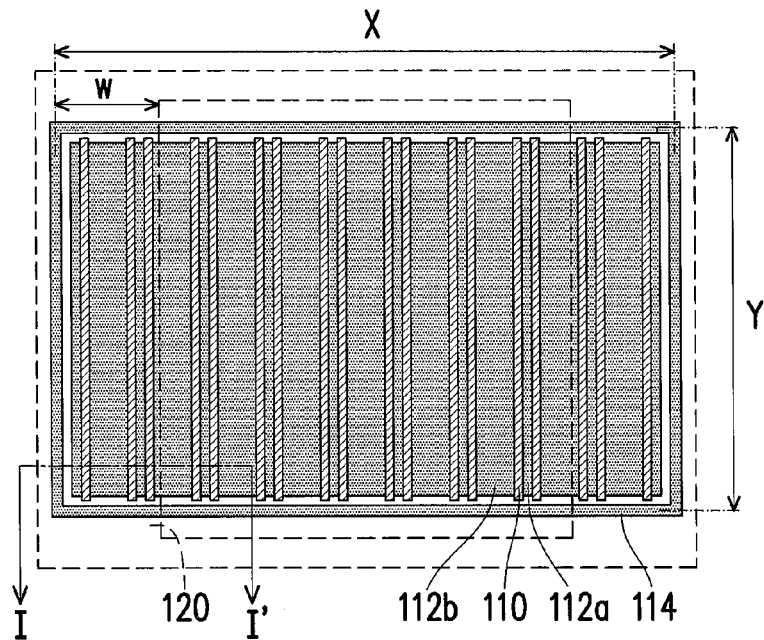
FIGS. 1A and 1B respectively illustrate a top view and an I-I' cross-sectional view of a semiconductor device according to an embodiment of this invention.
Figure 1B:
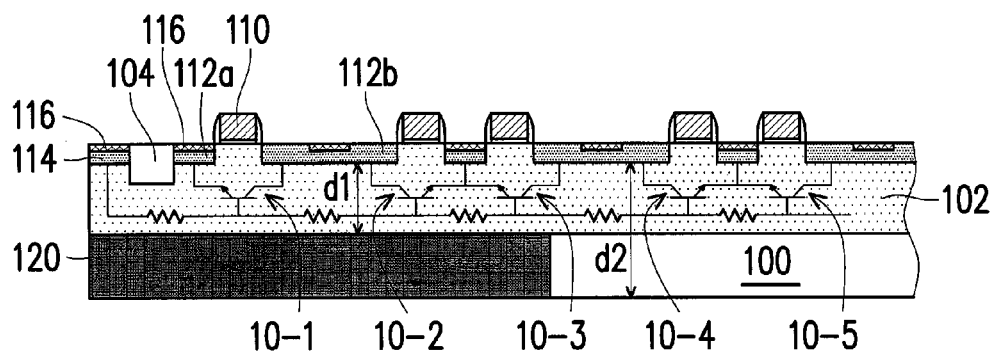

FIGS. 1A and 1B respectively illustrate a top view and an I-I' cross-sectional view of a semiconductor device according to an embodiment of this invention.

Referring to FIGS. 1A and 1B, the semiconductor device includes a multi-finger MOS device, which includes a P-type substrate 100, a P-well 102 in the substrate 100, an isolation layer 104 in the P-well 102, a plurality of substantially parallel finger gates 110 over the P-well 102, N-type source regions 112a and N-type drain regions 112b disposed in the substrate 100 between the gates 110 and arranged alternately, a P-type pick-up region 114 surrounding the source regions 112a and the drain regions 112b with the isolation layer 104 in between, a silicide layer 116 on the source regions 112a and the drain regions 112b, and an isolation layer 120 buried in the substrate 100 under some edge MOS elements of the multi-finger MOS device.

The substrate 100 may be a bulk substrate, an epitaxy substrate, or a silicon-on-insulator (SOI) substrate. The gates 110 may include doped polysilicon. The dopant concentration of the P-well 102 is higher than that of the P-type substrate 100 but lower than that of the P-type pick-up region 114. The width of each drain region 112b is larger than that of each source region 112a.

In the multi-finger device, the N-type source region 112a and the N-type drain region 112b of each MOS element, the P-well 102, and the P-type substrate 100 form a parasitic BJT 10-n (n=1, 2, . . . ), through which the ESD current is released.

The isolation layer 120 makes the bottom depth of the electrical conduction path in the P-well 102 in the corresponding area smaller than that of the electrical conduction path in the P-well 102 and the substrate 100 in the area without the isolation layer 120. In other words, the distance d1 between the level of the bottoms of the source and drain regions 112a and 112b and the top surface of the isolation layer 120 is smaller than the distance d2 between the above level and the bottom level of the substrate 100 in the area without the isolation layer 120.

At each of the left and right edges of the above multi-finger MOS device, the isolation layer 120 is located under at least one edge MOS element, for example, three edge MOS elements as shown in the figures. The ratio (w/X) of the distance (w) between the pick-up region 114 and the inner border of the isolation layer 120 to the length (X) of the multi-figure device in the arrangement direction of the MOS element is preferably in the range of 0.12 to 0.33.

The isolation layer 120 may include an insulating layer or a deep N-well. As the isolation layer 120 includes a deep N-well, its formation can be easily integrated with usual CMOS process requiring deep wells. The dopant concentration of the deep N-well is lower than that of the N-type source regions 112a and the N-type drain regions 112b. As the isolation layer 120 includes an insulating layer, the insulating layer may include silicon oxide or silicon nitride.

Moreover, although the isolation layer 120 has a substantially uniform thickness from near the pick-up region 114 to apart from the same in this embodiment, it may alternatively have a thickness increasing toward the pick-up region 114 in a manner such that the bottom depth of the overlying electrical conduction path decreases toward the pick-up region 114. Such embodiment is described below in reference of FIG. 2.

Figure 2:
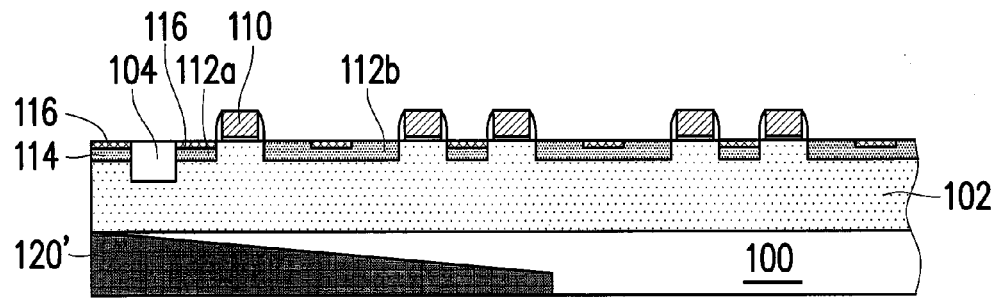
FIG. 2 illustrates a cross-sectional view of a semiconductor device according to another embodiment of this invention.

Referring to FIG. 2, the thickness of the isolation layer 120' increase smoothly toward the pick-up region 114, while the other parts of the device are the same as those in the precedent embodiment. Alternatively, the thickness of the isolation layer 120' may increase stepwise toward the pick-up region 114.

The above embodiments feature that the isolation layer 120 or 120' decreases the base resistance difference between central MOS elements and edge MOS elements of the multi-finger device. To demonstrate this, the base resistance values (relative values) of the respective BJTs in the multi-finger device shown in FIG. 1A/1B are calculated as Example 1, and those of a corresponding conventional multi-finger device without the deep N-well 120 are calculated as Comparative Example 1 for comparison.

For a conventional multi-finger device (Comparative Example 1) with a structure as shown in FIG. 1A/1B without the deep N-well 120, the resistance $R_{xy}$ between the pick-up region and a position (x, y) can be calculated with Eq. (1):

$$\frac{1}{R_{xy}} \propto \int_{x=0}^{X} \frac{1}{\sqrt{(X-x)^2 + y^2}} + \int_{x=0}^{X} \frac{1}{\sqrt{(X-x)^2 + (Y-y)^2}} + \int_{y=0}^{Y} \frac{1}{\sqrt{x^2 + (Y-y)^2}} + \int_{y=0}^{Y} \frac{1}{\sqrt{(X-x)^2 + (Y-y)^2}} \quad (1)$$

For a multi-finger device shown in FIG. 1A/1B of this invention (Example 1), the resistance between the pick-up region 114 and a position (x, y) can be calculated with Eq. (2):

$$\frac{1}{R_{xy}} \propto k \int_{x=0}^{w} \frac{1}{\sqrt{(w-x)^2 + y^2}} + k \int_{x=0}^{w} \frac{1}{\sqrt{(w-x)^2 + (Y-y)^2}} + k \int_{y=0}^{Y} \frac{1}{\sqrt{x^2 + (Y-y)^2}} + \text{minor terms}, \quad (2)$$

wherein k (<1) is the ratio of the substrate resistance in the area with the deep N-well 120 to that in the area of the P-well 102 without the deep N-well 120, w is defined as above, and the minor terms are integrations over the area without the deep N-well 120.

In Example 1 and Comparative 1, X=33 μm, and Y=24 μm. In Example 1 of this invention, k=0.98 (=7.23/7.33), and w=4 μm. The result of the numerical integrations at the position y=Y/2 for the respective BJT 10-n (n=1, 2, . . . , 18) with different positions x are listed in Table 1:

TABLE 1

Base resistance $R_{x,y=Y/2}$ (relative values) of the respective BJTs

| BJT No. (x=) | 1, 18 | 2, 17 | 3, 16 | 4, 15 | 5, 14 | 6, 13 | 7, 12 | 8, 11 | 9, 10 |
|---|---|---|---|---|---|---|---|---|---|
| $R_{x,y=Y/2}$ of Example 1 | 0.600 | 0.639 | 0.669 | 0.692 | 0.702 | 0.708 | 0.710 | 0.712 | 0.713 |
| $R_{x,y=Y/2}$ of Comparative Example 1 | 0.510 | 0.551 | 0.581 | 0.605 | 0.626 | 0.643 | 0.657 | 0.670 | 0.681 |

According to Table 1, the base resistance deviation in Example 1 is merely 17% (=(0.713−0.600)/[(0.713+0.600)/2]), while that in Comparative Example 1 is 29%. It is clear that that the isolation layer or deep N-well 120 greatly decreases the base resistance difference between central MOS elements and edge MOS elements of the multi-finger device.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor device, comprising:
    a substrate, including a first area and a second area, wherein the first area is closer to a pick-up region of the substrate than the second area;
    a well, located in the substrate and extending across the first and the second areas;
    a first MOS element of a first conductivity type in the first area;
    a second MOS element of the first conductivity type in the second area; and
    an isolation layer, buried in the substrate and located completely under the well in the first area,
    wherein the substrate has a second conductivity type, and a first bottom depth of a first electrical conduction path in the substrate in the first area is smaller than a second bottom depth of a second electrical conduction path in the substrate in the second area.

2. The semiconductor device of claim 1, further comprising:
    a deep well of the first conductivity type in the substrate of the first area, disposed in a manner such that the first bottom depth is smaller than the second bottom depth.

3. The semiconductor device of claim 2, wherein the first conductivity type is N-type and the second conductivity type is P-type.

4. The semiconductor device of claim 2, wherein the first conductivity type is P-type and the second conductivity type is N-type.

5. The semiconductor device of claim 1, which comprises an electrostatic discharge (ESD) device.

6. The semiconductor device of claim 5, wherein the ESD device comprises a multi-finger MOS device, and the first MOS element and the second MOS element are parts of the multi-finger MOS device.

7. The semiconductor device of claim 1, wherein the first MOS element and the second MOS element comprise BJT elements, NMOS elements, LDMOS elements, or DDMOS elements.

8. The semiconductor device of claim 1, wherein the first bottom depth of the first electrical conduction path decreases toward the pick-up region.

9. The semiconductor device of claim 8, wherein the first bottom depth of the first electrical conduction path decreases smoothly or stepwise toward the pick-up region.

10. A semiconductor device, comprising:
    a substrate, including a first area and a second area, wherein the first area is closer to a pick-up region of the substrate than the second area;
    a well, located in the substrate and extending across the first and the second areas;
    a first MOS element of a first conductivity type, above a first level in the substrate in the first area;
    a second MOS element of the first conductivity type, above the first level in the substrate in the second area; and
    an isolation layer, buried in the substrate in the first area but not extending to the second area, and being completely under the well in the first area,
    wherein a first distance between the first level and a top of the isolation layer is smaller than a second distance between the first level and a bottom level of the substrate in the second area.

11. The semiconductor device of claim 10, wherein the isolation layer comprises an insulating layer.

12. The semiconductor device of claim 11, wherein the insulating layer comprises silicon oxide or silicon nitride.

13. The semiconductor device of claim 10, wherein the isolation layer comprises a deep well of the first conductivity type.

14. The semiconductor device of claim 13, wherein the first conductivity type is N-type and the second conductivity type is P-type.

15. The semiconductor device of claim 13, wherein the first conductivity type is P-type and the second conductivity type is N-type.

16. The semiconductor device of claim 10, which comprises an electrostatic discharge (ESD) device.

17. The semiconductor device of claim 16, wherein the ESD device comprises a multi-finger MOS device, and the first MOS element and the second MOS element are parts of the multi-finger MOS device.

18. The semiconductor device of claim 10, wherein the first MOS element and the second MOS element comprise BJT elements, NMOS elements, LDMOS elements, or DDMOS elements.

19. The semiconductor device of claim 10, wherein the isolation layer has a substantially uniform thickness from near the pick-up region to apart from the pick-up region.

20. The semiconductor device of claim 10, wherein a thickness of the isolation layer increases toward the pick-up region.

21. The semiconductor device of claim 20, wherein the thickness of the isolation layer increases smoothly or stepwise toward the pick-up region.

* * * * *